United States Patent
Harrand

Patent Number: 5,265,041
Date of Patent: Nov. 23, 1993

[54] BIDIMENSIONAL AIR FILTER

[75] Inventor: Michel Harrand, Seyssinet-Pariset, France

[73] Assignee: SGS-Thomson Microelectronics S.A., Gentilly, France

[21] Appl. No.: 926,815

[22] Filed: Aug. 7, 1992

[30] Foreign Application Priority Data

Aug. 9, 1991 [FR] France ................. 91 10425

[51] Int. Cl.$^5$ ............................................. G06F 15/31
[52] U.S. Cl. ........................ 364/724.05; 364/724.16
[58] Field of Search ........................ 364/724.05, 724.16

[56] References Cited

U.S. PATENT DOCUMENTS

| | | | |
|---|---|---|---|
| 4,328,426 | 5/1982 | D'Ortenzio | 364/724.05 X |
| 4,821,223 | 4/1989 | David | 364/724.05 |
| 4,941,191 | 7/1990 | Miller et al. | 364/724.05 X |

FOREIGN PATENT DOCUMENTS 61-088668  9/1986  Japan .

OTHER PUBLICATIONS

Suresh et al, "Exact Realization of 2-Dimensional Digital Filters by Separable Filters", *Electronics Letters* May 13, 1976 vol. 12 No. 10, pp. 242–244.

IEEE Transactions on Circuits and Systems, vol. 36, No. 6, Jun., 1989, pp. 813–820, Parhi et al: 'Concurrent Architectures for Two-Dimensional Recursive Digital Filtering'.

Primary Examiner—Tan V. Mai
Attorney, Agent, or Firm—Wolf, Greenfield & Sacks

[57] ABSTRACT

A bidimensional Finite Impulse Response (FIR) filter of rank 2p+1 for processing data associates a "vertical" filter and a "horizontal" filter. Each filter includes 2p+1 cells and circuitry for vertically scanning the data according to stripes having a height of p data; circuitry for simultaneously providing on a first line a datum of a stripe, on a second line a datum of the former stripe shifted by p data, and on a third line, a datum of the still former stripe again shifted by p data; and circuitry for, at each clock time, connecting each cell input to one of the three lines.

11 Claims, 4 Drawing Sheets

FIG. 1
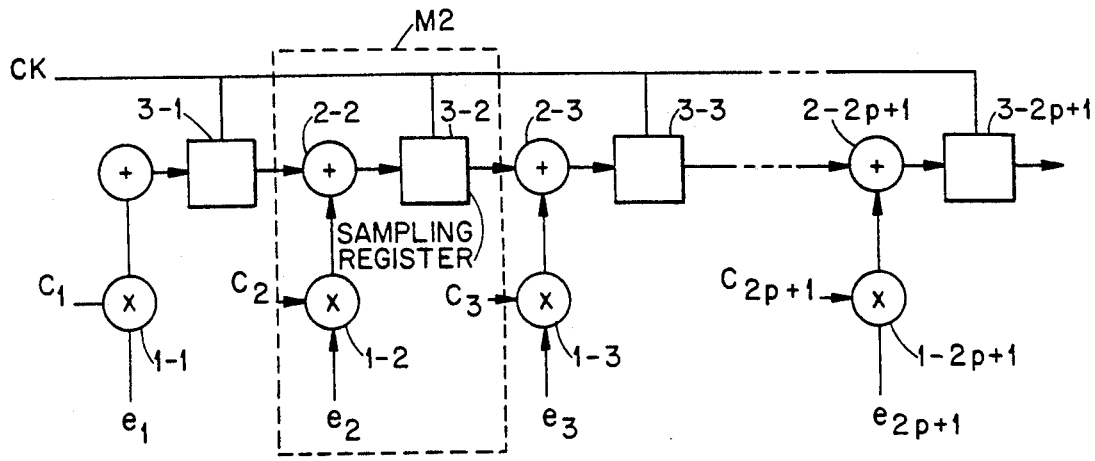
FIG. 2 (PRIOR ART)
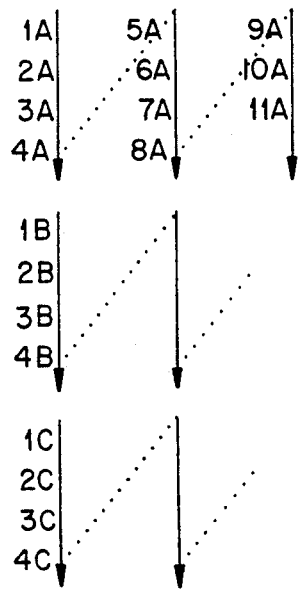
FIG. 3

BIDIMENSIONAL AIR FILTER

BACKGROUND OF THE INVENTION

The present invention relates to bidimensional filters of the finite impulse response (FIR) type such as used especially for encoding TV pictures, for example for achieving a so-called "subband" encoding. In this application, the invention will be described in relation to the processing of a TV picture in which a memory contains the successive pixels of a picture. However, it is clear that the invention applies generally to the filtering of data arranged according to a bidimensional matrix.

Given a picture constituted by pixels Pij, as represented in FIG. 1, where i is a line index included between 1 and M, and j is a column index included between 1 and N, bidimensional FIR filtering comprises performing operations of linear combination on sequences of one-line pixels and on sequences of one-column pixels. It is said that the filtering is of rank $2p+1$ if the considered sequence is a sequence associating $2p+1$ successive pixels.

Thus, vertical filtering is defined by the following relation (1):

$$Qij = \sum_{k=i-p}^{k=i+p} Ck \cdot Pkj \quad (1)$$

where Ck designates a coefficient, and horizontal filtering is defined by the following relation (2):

$$Rij = \sum_{k=j-p}^{k=j+p} Dk \cdot Qkj \quad (2)$$

where Dk designates a coefficient.

These operations being linear, it will be noticed that the order of the horizontal and vertical filtering operations is of no consequence.

FIG. 2 is a diagram of a conventional FIR filter, used as a basis for the construction of a horizontal or vertical filter. This filter includes a series of identical modules $M_1$ to $M_{2p+1}$. In the figure, module $M_2$ only is identified by a frame drawn in dotted lines. This module comprises a data input terminal e2 of a multiplier 1-2 where the input datum is multiplied by a coefficient C2. The figure shows the datum arriving on a single line. In fact, this datum is generally a binary word of several bits and input e2 corresponds to a bus comprising as many lines as bits included in the word. The output of multiplier 1-2 is sent to the first input of an adder 2-2, the second input of which receives the output of the preceding module. The adder output is connected to the input of a sampling register 3-2 which corresponds to a clock edge. The output of sampling register 3-2 is connected to the second input of the adder of the next module. All these registers are controlled by a clock CK which enables, at the introduction rate of the data, reading the datum present at the output of the preceding adder and sending the previously stored datum to the next adder.

It will be clear that such a filter, all the inputs of which are interconnected, enables performance of the operation indicated by formula (1). Indeed, considering the case where p=2 (5 modules), and assuming that data p1 . . . pn are successively introduced, output S provides at the sixth clock time:

Q13=C1 P11+C2 P12+C3 P13+C4 P14+C5 P15, at the seventh clock time:
Q14=C1 P12+C2 P13+C3 P14+C4 P15+C5 P16, and so forth.

various correction techniques are known by those skilled in the art to provide, if necessary, data Q11, Q12 which are available with the elementary circuit described above. Thus, in the conventional case where the data matrix, namely a TV pixel image is scanned by horizontal lines, the row data sequentially arrive and the filter easily lends itself to horizontal filtering.

But, for vertical filtering, pixels P11, P21, P31 . . . PM1 are to be sequentially provided to the filter before processing pixels P12, P22 . . . PM2. This implies, still in the case of conventional horizontal scanning, to provide upstream of the filter delay lines having substantially the duration of a line. For a filter of rank 2p+1, 2p delay lines are to be provided. Such an architecture is for example described in the Article by Rao et al., Proceedings of IEEE International Symposium on Circuits and Systems, New Orleans, La., May 1990, pages 3050-3052. The delay lines are conventionally achieved by memories and, for example, for a filter of rank 17 and pixels defined on 8 bits, 16 memories connected to the filter through 16 buses of 8 bits are to be provided. If the filter and the delay lines are achieved in various chips, this requires, for the filter chip, the provision of an extremely high number of pads, with a resulting very expensive casing (the cost of an integrated circuit casing increasing very quickly with the number of pins of this casing) and a limited efficiency. Consequently, it has been proposed to include the memories serving as delay lines in the filter chip. But then, the chip has a very large silicon surface. In addition, the optimized technologies for manufacturing memories are generally not the same as those used for manufacturing filter cells. As a result, the chip of the assembly is not optimized. Anyhow, this integration of filters and memories on a single chip becomes impossible when the rank of the filter becomes too high, for example 65, or when the data words to be processed contain too many bits, for example 16 or 32.

This problem is all the more crucial as, in some TV circuits, for example those provided for high definition TV, in which it is desired to use a subband encoding technique, several filters are provided in a single TV set.

SUMMARY OF THE INVENTION

Thus, an object of the invention is to provide a new architecture for a FIR bidimensional filter enabling to optimize the implementation of the vertical filter without adversely affecting the implementation of the associated horizontal filter.

A further object of the invention is to provide a bidimensional FIR filter in which the memory portion and the filter portion itself are achieved in separated chips with a limited number of links between both chips.

To achieve these objects and others, the invention generally provides a digital bidimensional filter of rank 2p+1 for processing matrix data, sequentially comprising a "vertical" filter and a "horizontal" filter. The matrix data are applied to the vertical filter by a vertical scanning circuit having horizontal bands of a height of p data of the data matrix, the horizontal filter receiving the output data of the vertical filter according to the same scanning mode.

More particularly, the invention provides a FIR bidimensional filter of rank 2p+1 for data processing associating a "vertical" filter and a "horizontal" filter, each filter comprising 2p+1 cells. Each cell comprises a multiplier having a data input for receiving data and a coefficient input for receiving a predetermined coefficient, the multiplier output being connected to the first input of an adder, the output of which is connected to a register, the register output being connected to the second input of the adder of the next cell. The registers are controlled at the rate of the data introduction. The vertical filter comprises means for vertically scanning the data along stripes having a height of p data; means for simultaneously providing on a first line a stripe datum, on a second line a datum of the preceding stripe shifted by p data, on a third line, a datum of the penultimate preceding stripe again shifted by p data; and means for, at each clock time, connecting each cell input to one of the three lines.

According to an embodiment of the invention, the horizontal filter comprises means for simultaneously providing to the inputs of the horizontal filter the output data of the vertical filter mutually shifted by p+1 data.

According to an embodiment of the invention, the inputs on lines 1, p+1 and 2p+1 of the vertical filter are direct and the other inputs are equipped with two-channel multiplexers controlled so that the connection sequence of inputs to the line is as follows:

input 1 : always connected to the first line;
input 1 (1<1<p+1: 1-1 times to the second line, then p-1+1 times to the first line;
input p+1 : always connected to the second line;
input m(p<m<2p+1: m-p-1 times to the third line, then 2p+1-m times to the second line;
input 2p+1: always connected to the third line; a sequencer indicating the first datum of a column by which this sequence starts.

BRIEF DESCRIPTION OF THE DRAWINGS

The foregoing and other objects, features and advantages of the invention will be apparent from the following detailed description of preferred embodiments as illustrated in the accompanying figures wherein:

FIG. 1, above described, shows a picture memory;

FIG. 2, above described, shows a conventional cell of a FIR filter;

FIG. 3 shows a scanning mode used according to the invention;

DETAILED DESCRIPTION OF THE INVENTION

In order to facilitate and simplify the practical implementation of a FIR bidimensional filter, the invention uses a stripe-type vertical scanning rather than a conventional raster horizontal scanning.

FIG. 3 illustrates the scanning mode used and the notations that will be used in the description that follows.

Hereafter, to simplify the description, the specific case of a recursive filter of rank 9 will be considered, that is, p=4 and 2p+1=9. In that case, the invention uses a vertical scanning through stripes having a height of p=4 pixels. FIG. 3 illustrates three successive scanning stripes, the elements of the first stripe being designated vertically by 1A, 2A, 3A, 4A; 5A, 6A, 7A, 8A; 9A, 10A, 11A, 12A; 13A . . . , the corresponding elements of the next two stripes being designated by the same number and respectively by letters B and C.

Figure 4:
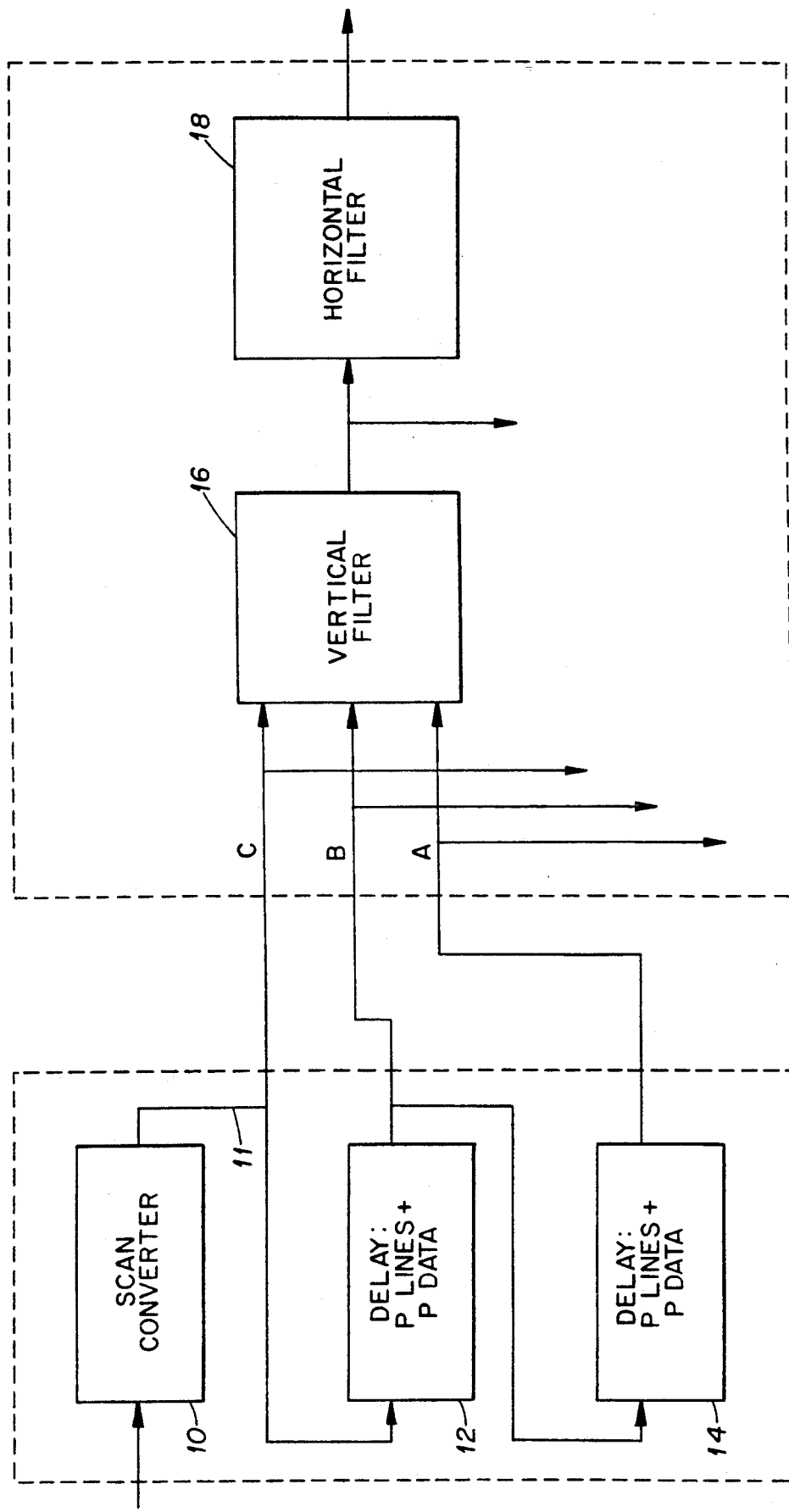
FIG. 4 shows the general architecture of a filter according to the invention.

FIG. 4 shows the general architecture of a bidirectional, vertical and horizontal filtering system, according to the invention.

This system comprises a scanning conversion circuit 10 providing a vertical stripe scanning of the type illustrated in FIG. 3 at an output 11. This circuit is followed by two delay memories of p lines+p data (here, p=4). C, B and A designate buses carrying the output of the scanning conversion circuit 10, of the first delay memory 12, and of the second delay memory 14, respectively. These outputs C, B and A are sent to a vertical filter 16 and, if necessary, to other analog vertical filters (not shown). The vertical filter output is sent to a horizontal filter 18 and, if necessary, to other horizontal filters (not shown).

Figure 5:
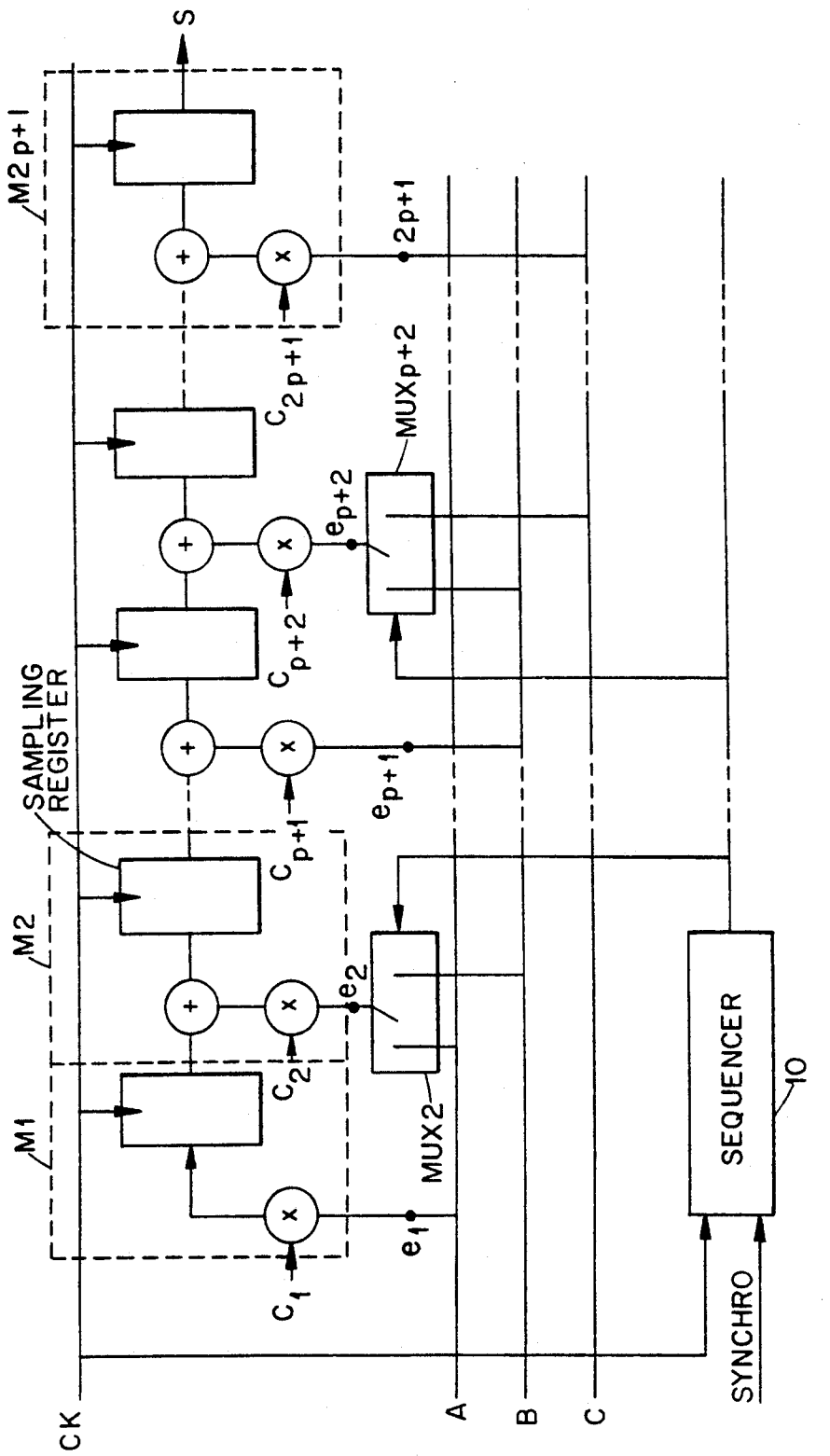
FIG. 5 shows the filter portion itself of a vertical filter according to the invention.

FIG. 5 shows an embodiment of the vertical filter 16 and exemplifies its connections with buses A, B and C.

For reasons which will appear later on, input $e_1$ of cell $M_1$ is connected to bus A, input $e_{p+1}$ of cell $M_{p+1}$ is connected to bus B, and input $e_{2p+1}$ of cell $M_{2p+1}$ is connected to bus C. The cells included between the cell $M_1$ and cell $M_{p+1}$ have their input connected through a multiplexer MUX to either one of buses A and B, and the cells included between cell $m_{p+1}$ and cell $M_{2p+1}$ have their input connected through a multiplexer to either one of buses B and C.

Referring to the notations of FIG. 3, it clearly appears that it is desired to sequentially provide to inputs e1-e9, when p=4, the following signals:

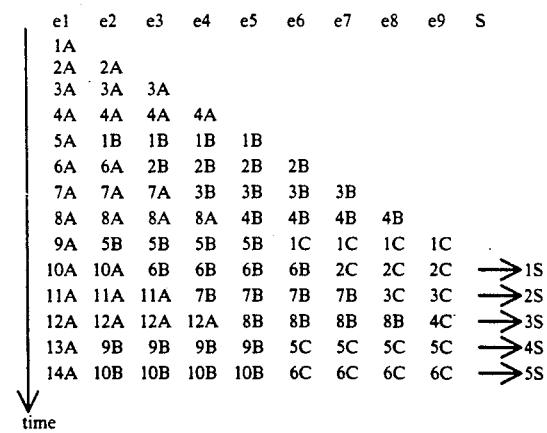

| e1 | e2 | e3 | e4 | e5 | e6 | e7 | e8 | e9 | S |
|----|----|----|----|----|----|----|----|----|---|
| 1A |    |    |    |    |    |    |    |    |   |
| 2A | 2A |    |    |    |    |    |    |    |   |
| 3A | 3A | 3A |    |    |    |    |    |    |   |
| 4A | 4A | 4A | 4A |    |    |    |    |    |   |
| 5A | 1B | 1B | 1B | 1B |    |    |    |    |   |
| 6A | 6A | 2B | 2B | 2B | 2B |    |    |    |   |
| 7A | 7A | 7A | 3B | 3B | 3B | 3B |    |    |   |
| 8A | 8A | 8A | 8A | 4B | 4B | 4B | 4B |    |   |
| 9A | 5B | 5B | 5B | 5B | 1C | 1C | 1C | 1C |   |
| 10A| 10A| 6B | 6B | 6B | 6B | 2C | 2C | 2C | →1S |
| 11A| 11A| 11A| 7B | 7B | 7B | 7B | 3C | 3C | →2S |
| 12A| 12A| 12A| 12A| 8B | 8B | 8B | 8B | 4C | →3S |
| 13A| 9B | 9B | 9B | 9B | 5C | 5C | 5C | 5C | →4S |
| 14A| 10B| 10B| 10B| 10B| 6C | 6C | 6C | 6C | →5S | time

The general rule to be followed is deduced from this table. Bus B must present the data of bus A shifted by p (=4) lines plus p (=4) clock periods and, similarly, bus C must present the data of bus B delayed by p lines+p clock periods in order to, for example, simultaneously present to the filters pixels 9A, 5B and 1C; 10A, 6B and 2C; 11A, 7B and 3C . . . This result is obtained with the delay circuits adjusted in the way illustrated in FIG. 4. On the other hand, it can be seen that the control sequences of the multiplexers respectively choose each of the inputs as follows:

```
  A  B  B  B  B  C  C  C  C
  A  A  B  B  B  B  C  C  C
  A  A  A  B  B  B  B  C  C
  A  A  A  A  B  B  B  B  C
↓
time
```

This sequence is periodic with a period 4 (p) and starts at the same time as a pixel of the upper line is presented (1A, for example). A sequencer 20, triggered by a synchronization signal, provides this function. It can be seen from the above table that the inputs 1, 5 and 9 (1, p+1 and 2p+1) need not being associated with a multiplexer.

More generally, for a filter of rank 2p+1, each of the three buses A, B, C scans p video lines and the control sequence of the multiplexer, periodic with a period p, is as follows:

| | |
|---|---|
| Input $e_1$ | always connected to A |
| Input $e_2$ | 1 time B, then (p-1) times A |
| Input $e_l$ (1 < l < p + 1) | l-1 time B, then (p-l + 1) times A |
| Input $e_{p+1}$ | always connected to B |
| Input $e_m$(p + 1 < m < 2p + 1) | m-p-1 times C then 2p + 1-m times B |
| Input $e_{2p+1}$ | always connected to C |

Referring back to FIG. 4, it is noted that the circuit according to the invention connects the assemblies of storage and scanning conversion circuits to a filter circuit with only three buses instead of 2p buses, as in the prior art. This is very significant when the filter is of a high rank (p=8, 16, or 32) and that the data to be filtered comprise a high number of bits (8, 16 or 32). Thus, it is possible to manufacture filtering circuits using processor-type technologies which are particularly well adapted for this fabrication. It is also possible to manufacture the circuit comprising the memories including adapted circuits as well, for example DRAM memory circuits, which permits integrating a very high number of cells on a relatively small surface. It will be noted that, as compared to conventional circuits, the memory part itself according to the invention comprises two p-lines memories plus a scanning conversion memory including p lines too. Whereas, conventionally, only 2p memories of one line have been used. This drawback of the invention is only apparent, on the one hand, because of the major advantage brought by the decrease in the number of buses connecting the memories to the filter and, therefore, in the number of pads for the filtering circuit and, on the other hand, due to the fact that, according to the invention, the memories can be integrated in a separate chip made according to an adapted technology. In addition, it will be noted that the scanning conversion circuit is also often used in other parts of a system processing TV pictures.

Figure 6:
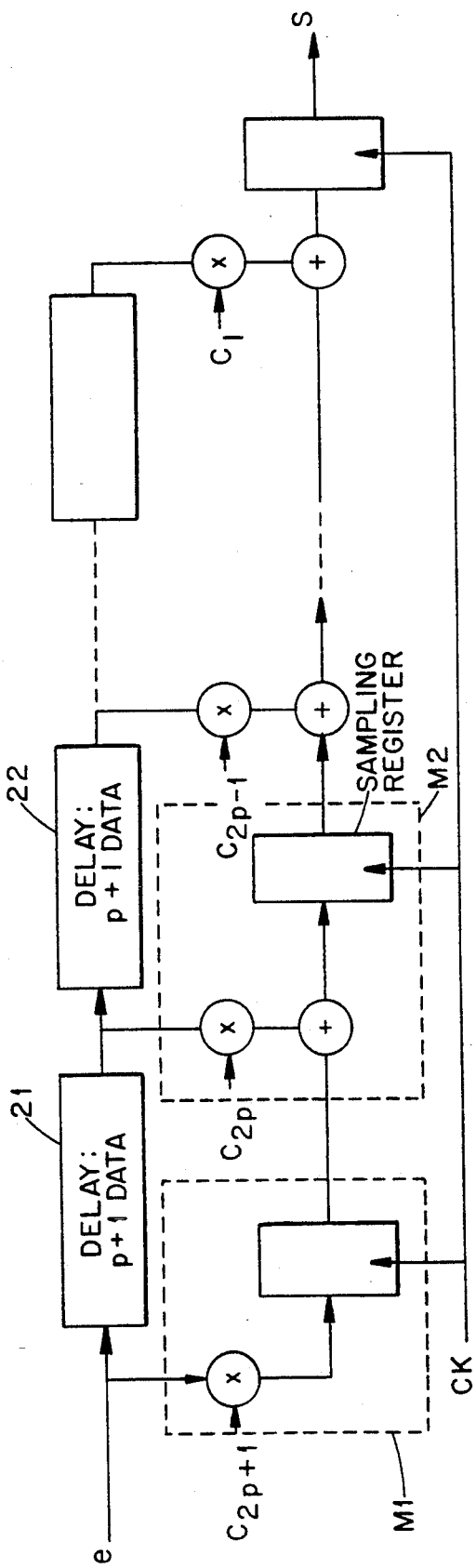
FIG. 6 shows the filter portion itself of a horizontal filter according to the invention.

On the other hand, as will be shown in connection with FIG. 6, the major simplification brought by the invention for achieving the vertical filter does not cause a significant complexity increase of the horizontal filter.

At the vertical filter output, data are scanned by stripes. Therefore, the horizontal filter must receive on its successive inputs data separated one from the other by p+1 clock pulses. This is easily achieved with the circuit illustrated in FIG. 6, where the same reference characters designate the same elements as in the preceding figures. It will be noted that, between each input, a delay memory 21, 22 ... of p+1 data is provided, that is, a small-size memory as compared to one-line duration memories (it is to be remembered that usually, for conventional TV sets, a line comprises about 700 pixels and in high definition TV, about 2,000 pixels).

In subband encoding applications, a selected number of data of a sequence will conventionally be eliminated at the output of each filter and an appropriate scanning rate will be chosen.

I claim:

1. A bidimensional filter having a predetermined rank for processing matrix data including column-oriented data and row-oriented data, comprising:

a vertical filter having circuitry for scanning column-oriented data in columns having a height determined by the predetermined rank of the filter, the circuitry including a scan converter for converting column-oriented data in columns having a height determined by the predetermined rank, a first delay circuit, coupled to the scan converter circuit for delaying signals received from the scan converter for a first predetermined time period, and a second delay circuit, coupled to the first delay circuit, for delaying signals received from the first delay circuit for a second predetermined time period and circuitry for processing the scanned data; and a horizontal filter, coupled to and receiving processed data from the vertical filter, having circuitry for converting the column-oriented data from the vertical filter into row-oriented data and circuitry for processing the converted data, the circuitry for converting the column-oriented data from the vertical filter into row-oriented data including a delay circuit, coupled to each cell in the horizontal filter, for delaying a signal received at an input of the delay circuit by p+1 data elements.

2. The filter of claim 1, wherein the filter is of rank 2p+1 and the vertical filter further comprises 2p+1 sequentially-connected cells for filtering signals received by each of the cells, wherein a first cell is coupled to the scan converter circuit, a p+1 cell is coupled to the first delay circuit, and a 2p+1 cell is coupled to the second delay circuit.

3. The filter of claim 2, further comprising a plurality of multiplexers, coupled to predetermined ones of the 2p+1 cells, for selecting signals from one of the scan converter circuit, the first delay circuit, and the second delay circuit, to be supplied to one of the predetermined cells, and a sequencer circuit for controlling the multiplexers to select signals in a predetermined order.

4. The filter of claim 3, wherein the sequencer controls the multiplexers to couple the signals from the scan converter circuit, the first delay circuit, and the second delay circuit to each one of the 2p+1 cells in a cyclical order wherein a first cell is always coupled to the scan converter;

an l cell, wherein 1 < l < p+1, is coupled to the first delay circuit for l-1 clock periods and then for p-l+1 clock periods to the scan converter;

a p+1 cell is always coupled to the first delay circuit;

an m cell, wherein p < m < 2p+1, is coupled to the second delay circuit for m-p-1 clock periods and then for 2p+1-m clock periods to the first delay circuit; and a 2p+1 cell is always connected to the second delay circuit.

5. The filter of claim 4, wherein the horizontal filter further comprises 2p+1 sequentially-connected cells for filtering signals received by each of the cells.

6. A method for performing finite impulse response filtering on matrix data including column-oriented data and row-oriented data, comprising the steps of:
- scanning the column-oriented data in columns of data having a height determined by a predetermined filter rank using a scanning circuit including a scan converter and at least one delay memory;
- processing the columns of data to provide column-oriented filtered data in a first processing step;
- converting the column-oriented filtered data into row-oriented data using a delay circuit for delaying a signal received at an input of the delay circuit by p+1 data elements; and
- processing the row-oriented data to provide filtered matrix data in a second processing step.

7. The method of claim 6, further comprising the steps of, after scanning the column-oriented data, transmitting the columns of data for processing in the first processing step and performing a first delaying step on the columns of data to provide columns of data delayed by a first predetermined time period.

8. The method of claim 7, further comprising the steps of, transmitting the data delayed by the first predetermined time period for processing in the first processing step and performing a second delaying step on the columns of data delayed by the first delaying step to provide columns of data delayed by a second predetermined time period and transmitting the data delayed by the second time period for processing in the first processing step.

9. The method of claim 8, further comprising the step of sequencing the columns of data, the data delayed by the first delaying step, and the data delayed by the second delaying step.

10. The method of claim 9, wherein the predetermined filter rank is 2p+1 where p is a number of rows in the matrix that occur with a period of p, further comprising the step of providing 2p+1 sequentially-connected cells for filtering signals received by each cell.

11. The method of claim 10, wherein the step of sequencing includes sequencing the data in a cyclical order comprising the steps of
- always coupling a first cell to the columns of data;
- coupling an l cell, wherein $1 < l < p+1$, to the data delayed by the first predetermined time period for l-1 clock periods and then for p-l+1 clock periods to the columns of data;
- always coupling a p+1 cell to the data delayed by the first predetermined time period;
- coupling an m cell, wherein $p < m < 2p+1$, to the data delayed by the second predetermined time period for m-p-1 clock periods and then for 2p+1-m clock periods to the data delayed by the first predetermined time period; and
- always coupling a 2p+1 cell to the data delayed by the second predetermined time period.

* * * * *